United States Patent [19]

Eggermont

[11] 4,002,981
[45] Jan. 11, 1977

[54] DIGITAL CONVERTER FROM DELTA-MODULATED SIGNALS INTO PCM SIGNALS

[75] Inventor: Ludwig Desiré Johan Eggermont, Eindhoven, Netherlands

[73] Assignee: U.S. Philips Corporation, New York, N.Y.

[22] Filed: Dec. 30, 1974

[21] Appl. No.: 537,316

[30] Foreign Application Priority Data

Jan. 21, 1974 Netherlands ............... 7400764

[52] U.S. Cl. .................... 325/38 R; 325/38 B; 325/62; 340/347 DD; 332/9 R
[51] Int. Cl.$^2$ ............................................ H04B 7/17
[58] Field of Search ............... 325/38 B, 38 R, 62; 340/347 DD; 179/15 AP, 15 V; 332/9 R, 9 T, 11 R, 11 D

[56] References Cited

UNITED STATES PATENTS

| | | | |
|---|---|---|---|
| 3,596,267 | 7/1971 | Goodman | 325/38 B |
| 3,691,554 | 9/1972 | Marschall | 340/347 DD |
| 3,707,712 | 12/1972 | Deschenes et al. | 325/38 B X |
| 3,766,546 | 10/1973 | Aaron et al. | 340/347 DD |
| 3,772,682 | 11/1973 | Flanagan | 340/347 DD |

*Primary Examiner*—Robert L. Richardson
*Assistant Examiner*—Michael A. Masinick
*Attorney, Agent, or Firm*—Frank R. Trifari; Daniel R. McGlynn

[57] ABSTRACT

A digital circuit arrangement for directly converting compressed DM or DPCM signals into PCM signals, comprising a digital filter and a step size control circuit in which a DM bit or a DPCM code word and the associated step size code word are simultaneously applied to the digital filter.

7 Claims, 8 Drawing Figures

DIGITAL CONVERTER FROM DELTA-MODULATED SIGNALS INTO PCM SIGNALS

The invention relates to a digital arrangement for converting a compressed delta-modulated signal into a pulse code-modulated signal (PCM). The compressed delta-modulated signal is coded in accordance with a predetermined method of controlled step size and comprises a succession of code words occurring with a given sampling frequency, each code word consisting of at least one bit; the pulse code-modulated signal is constituted by a succession of multi-bit code words occurring with a given sampling frequency which is a fraction of the sampling frequency with which the code words occur in the delta-modulated signal.

A delta-modulated signal consisting of one-bit code words will hereinafter be referred to as a DM signal in which the succession of "0" and "1" bits (or the succession of +1 and −1 bits) each characterize the polarity of the difference in value between the analog data signal to be transmitted and a feedback signal which is derived from DM bits that occurred at previous sampling instants. A delta-modulated signal consisting of multi-bit code words will be referred to as a differential pulse code modulation signal (DPCM) in which each of these code words characterize the polarity and the value of the difference in value between the data signal to be transmitted and a feedback signal derived from the DPCM code words that occurred at previous sampling instants.

To realize a compressed delta-modulated signal different methods are known, for example: continuous delta modulation (see Philips Research Reports 1968, Vol. 23, pgs. 233–246; digitally controlled delta modulation (DCDM); high information delta modulation (HIDM) (see for example Panter; McGraw-Hill, 1965, pgs. 694–696). All these so-called compansion methods for the delta-modulated signal have for their object to realise an adaptation during modulation and demodulation of the used step size to the level of the changes of the original analog data signal in order to be able to suffice with a considerably lower sampling frequency than is possible in a so-called uniform delta-modulated signal in which only one value of the step size is used.

This considerable decrease of the sampling frequency is offset by the fact that when using one of the above-mentioned compression methods the separate code words in the delta-modulated signal do not uniformly represent the actual value of a change of the original analog data signal relative to the said feedback signal, but this actual value is to be derived from the succession of code words in the delta-modulated signal.

In order to convert such a compressed delta-modulated signal into a PCM signal it is known to convert this compressed delta-modulated signal in advance into a uniform delta-modulated signal in which each code word characterizes uniformly the variation of the original analog signal relative to said feedback signal.

An arrangement operating in this manner introduces, however, serious non-linear distortions and moreover such a high sampling frequency is required in this case (in the order of several MHz) for the uniform delta-modulated signal that such an arrangement is not suitable for integration by means of the modern MOS-techniques. In fact, in such an arrangement a very high processing speed of the different DM code words is required which becomes manifest in a clock frequency of several dozen MHz.

The invention has for its object to provide an arrangement of the kind described in the preamble which completely obviates the above-mentioned drawbacks and which guarantees with a very limited clock frequency of, for example, 1 MHz a minimum value of the signal-to-noise ratio over a large dynamic range of, for example, 30 dB. According to the invention this arrangement is constituted by: an input circuit comprising a delay circuit to which input circuit the compressed delta-modulated signal is applied and an auxiliary code word is written in the delay circuit for each of the code words in the delta-modulated signal; a clock pulse generator for generating control pulses applied to the delay circuit for controlling the delay time; a digital step size control circuit to which the delta-modulated signal is applied for generating a digitally coded step size word for each of the code words in the delta-modulated signal; a source for a given number of digitally coded filter coefficients; a multiplier to which the auxiliary code words and the filter coefficients are applied for generating a number of second code words corresponding to the number of filter coefficients, which second code words each indicate the digital product of a code word in the delta-modulated signal, an associated step size word determined by the step size control circuit and an associated filter coefficients; a combination device to which the second code words are applied for addition and which is controlled by clock pulses of the clock pulse generator, said clock pulses occurring with a period which is an integral multiple of said sampling period, while according to said clock pulses the combination device periodically supplies code words which constitute said PCM signal.

The invention and its advantages will now be described in greater detail with reference to the Figures.

Figure 1:
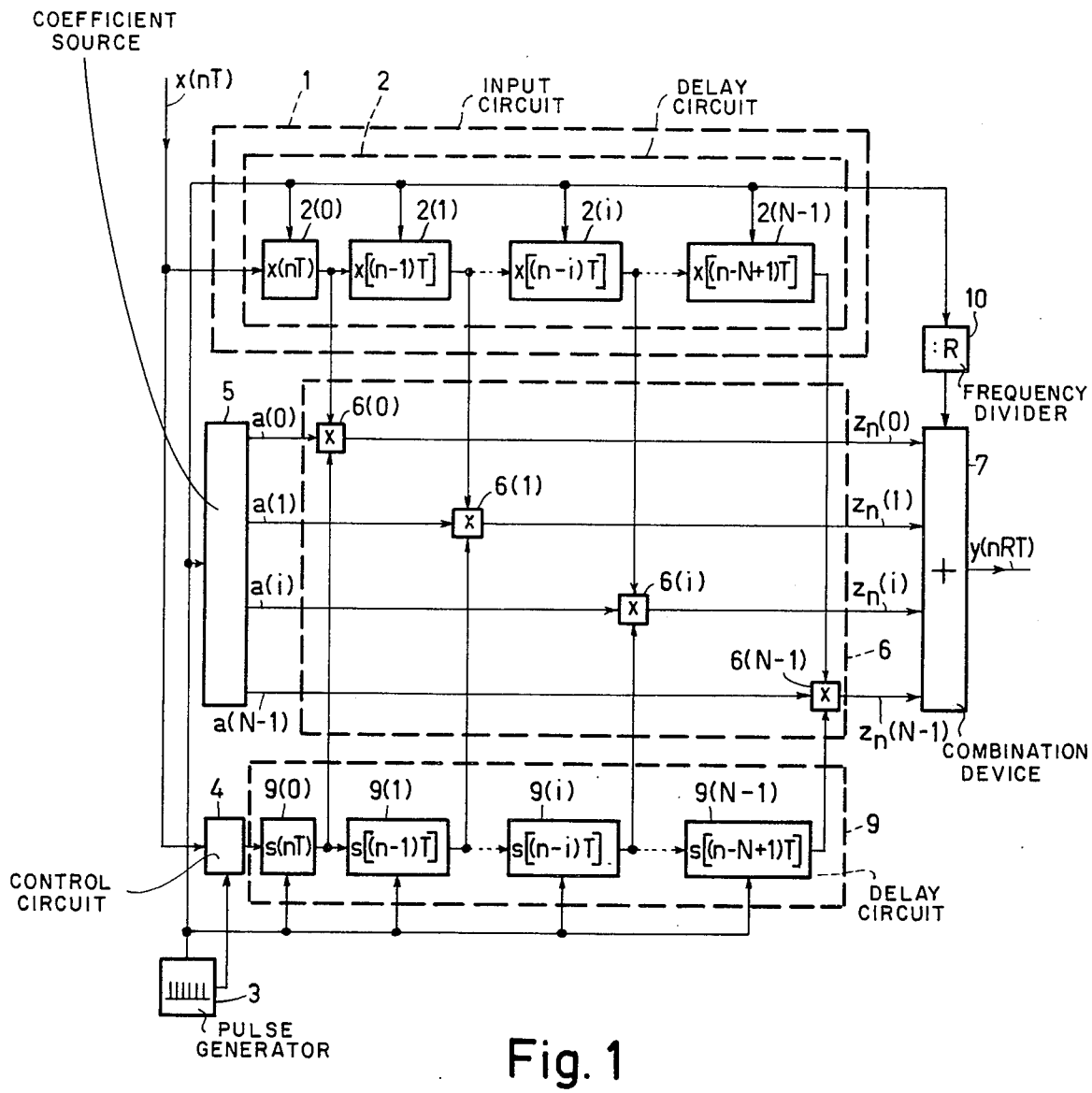
FIG. 1 shows an arrangement according to the invention for converting a DM signal into a PCM signal.

The arrangement according to the invention shown in FIG. 1 is adapted to convert a compressed delta-modulated signal into a pulse code-modulated signal (PCM), which compressed delta-modulated signal is coded in accordance with a predetermined method of controlled step size and is constituted by a succession of code words occurring with a given sampling frequency and each consisting of at least one bit, which pulse code-modulated signal is constituted by a succession of multi-bit code words occurring with a given sampling frequency which is a fraction of the sampling frequency with which the code words occur in the delta-modulated signal.

More particularly the arrangement shown is adapted to convert a delta-modulated signal constituted by one-bit code words occurring with a given delta modulation (DM) sampling frequency $f_d$ of, for example, 40 KHz into a 12-bit PCM code words occurring with a given PCM sampling frequency $f_o$ of, for example, 8 KHz. The delta-modulated signal is assumed to be obtained by delta modulation of an analog data signal located in the frequency band of 0–4 KHz while a step size control is used in the delta modulator in accordance with the method of DCDM (digitally controlled delta modulation). The one-bit code words referred to as DM bits obtained in this method are represented in the conventional manner by one of the binary numbers 1 and 0. In this case a 1 characterizes an increase and a 0 characterizes a decrease in the instantaneous value of the analog speech signal at a given DM sampling instant relative to the instantaneous value of a feedback signal (prediction signal) which is derived in the DM coder from the DM bits that occurred at previous sampling instants. In the Figure these one-bit code words are represented by $x(nT)$ indicating that these DM bits occur at instants which are an integral multiple of the DM sampling period $T = 1/f_d$; this means that these DM bits occur at instants $t = nT$ where $n = 0, 1, 2, 3, \ldots$ The PCM sampling frequency of 8 KHz for the 12-bit PCM code words is chosen to be a factor of R = 5 smaller than the DM sampling frequency of 40 KHz. In this embodiment this PCM sampling frequency $f_o$ thus corresponds to the Nyquist sampling frequency of 8 KHz for an analog data signal located in the frequency band of 0–4 KHz. More particularly these 12-bit PCM code words of each of the said analog data signals represent the instantaneous value at instants which are determined by the PCM sampling frequency $f_o$. In the Figure these 12-bit PCM words are indicated by $y(nRT)$. This expression where $n = 0, 1, 2, 3 \ldots$, indicates that the PCM words do not occur with a period $T$ of the DM sampling period, but with a period which is a factor of R (=5) larger.

In order to generate PCM words exclusively by digital process from the supplied compressed DM signals in this arrangement while obviating the influence of the signal-to-quantisation noise ratio and preventing non-linear distortion as well as a very high frequency clock pulse generator of several dozen MHz, this arrangement according to the invention is provided with an input circuit 1 comprising a delay circuit 2 to which input circuit said compressed delta-modulated signal is applied according to which in said delay circuit an auxiliary code word is written for each of the code words $x(nT)$ in the delta-modulated signal; a clock pulse generator 3 for generating control pulses applied to said delay circuit 2 for controlling the delay time; a digital step size control circuit 4 to which said delta-modulated signal is applied for generating a digitally coded step size word $s(nT)$ for each of the code words $x(nT)$ in the delta-modulated signal; a source 5 for a given number of digitally coded filter coefficients; a multiplier 6 to which said auxiliary code words and said filter coefficients are applied for generating a number of second code words corresponding to the number of filter coefficients and each indicating the product of a code word $(x(nT)$ in the delta-modulated signal, an associated step size $s(nT)$ determined by the step size control circuit and an associated filter coefficient; a combination device 7 to which said second code words are applied for addition and which is controlled by clock pulses from said clock pulse generator, which clock pulses occur with a period RT which is an integral multiple R of said sampling period T of the delta-modulated signal according to which clock pulses the combination device periodically supplies code words constituting said PCM signal.

In the embodiment shown in FIG. 1 the input circuit 1 exclusively includes the delay circuit 2 which is formed as a shift register having N shift register elements $2(0), 2(1), \ldots 2(i), \ldots 2(N-1)$. The DM bits $x(nT)$ are directly applied to this shift register 2 and shifted in the same rhythm as that with which they are applied to this shift register. This shifting of the DM bits in the shift register 2 is controlled by the clock pulse generator 3 which for this purpose is synchronized in the conventional manner at the said DM sampling frequency of 40 KHz.

The digital step size control circuit 4 whose structure will be further described with reference to FIG. 2 determines, as is common practice for DCDM, the step size $(s(nT))$ associated with the DM bit $x(nT)$ from a succession of at least three DM bits $x(nT)$, $x[(n-1)T]$ and $x[(n-2)T]$ and the step size $s[(n-1)T]$. In this embodiment these step sizes are applied to a delay circuit 9 in the rhythm with which the DM bits $x(nT)$ occur. This delay circuit 9 is constituted by a number of delay sections $9(0), 9(1), \ldots 9(i) \ldots 9(N-1)$ corresponding to the number of shift register elements in the shift register 2 and each being suitable for storing and supplying a complete code word $s(nT)$. These words $s(nT)$ are shifted to the successive sections under the control of the clock pulse generator 3 and shifting is simultaneously effected with shifting of the DM bits $x(nT)$ in the register 2.

The source 5 for the digitally coded filter coefficients may be formed, for example, as a so-called ROM (Read Only Memory) and it supplies a number of filter coefficients $a(0), \ldots, a(i), \ldots, a(N-1)$ which is equal to the number of DM bits stored in register 2. These filter coefficients are derived from this source through N parallel output leads.

For a description of a ROM, reference is made to J. Embinder, "Semiconductor Memories", Wiley 1971.

In this embodiment the multiplier 6 is constituted by N multiplier sections $6(0), \ldots, 6(i), \ldots, 6(N-1)$ each formed in the manner as will be further described with reference to FIG. 3. In the embodiment shown a filter coefficient $a(i)$, a DM bit $x[(n-i)T]$ stored in the register element $2(i)$ having the same serial number $i$ as the described filter coefficient and a step size $s[(n-i)T]$ associated with this DM bit and stored in the delay section $9(i)$ are applied simultaneously to each of the multiplier sections $6(i)$. By multiplication of the numbers applied to the multiplier sections a second code word is supplied within a period T of the DM bits by each of the multiplier sections $6(0), \ldots, 6(i), \ldots, 6(N-1)$. These second code words occur in the embodiment shown at parallel output leads of the multiplier 6 and are denoted by $z_n(0), \ldots, z_n(i), \ldots, z_n(N-1)$ in the Figure. The combination device 7 constitutes in the conventional manner the sum $$\sum_{i=0}^{N-1} z_n(i)$$

of these numbers. The index n of $z_n(i)$ is equal to the factor n in $x(nT)$ of the DM bit $x(nT)$ written in the first shift register element $2(0)$.

In this embodiment the 1 and 0 DM bits are more particularly considered, as is common practice for delta modulation, as the "+" and "−" polarity bit of the step size code word associated with the relevant DM bit. Together with the polarity bit characterized by the DM bit this code word indicates a number of sign and magnitude representation and in, for example, a fixed comma representation. These numbers and also the filter coefficients $a(0), \ldots, a(i), \ldots, a(N-1)$ comprise, for example, four magnitude bits in addition to the polarity bit which likewise as the composite bits of the numbers $s(nT)$, $z_n(i)$ and $y(nRT)$ are assumed to occur one after the other (in series).

The shift register 2, the delay circuit 9, the multiplier 6, the source 5 and the combination device 7 represent a non-recursive digital filter whose transfer characteristic is given in the conventional manner by the choice of the filter coefficients $a(i)$. More particularly the filter coefficients are determined in accordance with one of the conventional methods for transmission by means of delta modulation of a data signal having a bandwidth of 0–4 KHz in such a manner that the transfer characteristic of the digital filter has a low-pass character with a very accurately defined cut-off frequency of 4 KHz. As a result the frequency spectrum of the delta-modulated signal applied to the arrangement is accurately limited to 4 KHz so that quantisation noise components of the delta-modulated signal located beyond the signal band of 0–4 KHz are suppressed.

Only the latter signal rigourously limited in bandwidth is suitable for transmission without influencing the signal-to-quantisation noise ratio in the form of multiple bit (12-bit) PCM words which occur at a sampling frequency which is considerably lower than the DM sampling frequency of 40 KHz. As already stated, this PCM sampling frequency is conventionally 8 KHz for transmission of data signals in the band of 0–4 KHz.

In the embodiment shown the PCM code words $y(nRT)$ at the said frequency of 8 KHz are derived from the combination device 7. To this end this combination device 7 not only counts the series of second code words $z_n(0), \ldots, z_n(i), \ldots, z_n(N)$ together occurring within a sampling period T of the DM bit, as is common practice in non-recursive digital filters, but also adds together the series of second code words occurring in the rhythm of the DM bits. This means that this combination device not only forms the sum $$\sum_{i=0}^{N-1} z_n(i) \text{ but the sum } \sum_{n=0}^{\infty} \sum_{i=0}^{N-1} z_n(i)$$

and has thus the form of an accumulator. As a result the integration of the DM bits required for delta modulation signals is realized. The contents of the combination device 7 thus always give the quantized instantaneous value of the analog data signal characterized by the compressed delta modulation signal. To obtain a succession of 12-bit PCM words which occur at the said sampling frequency of 8 KHz a code word consisting of 12 bits is read out of the combination device 7 with the PCM sampling frequency $f_o = 8$ KHz which is a factor of 5 lower than the DM sampling frequency $f_d$. This frequency $f_o$ is derived with the aid of a frequency divider 10 having a division factor of R=5 from the shift pulses of the shift register 2.

In the arrangement to the invention the fact is utilized that the PCM sampling frequency is lower than the DM sampling frequency so that the compressed delta-modulated signal can be directly converted into a PCM signal; that is to say, without previous conversion into a uniform delta-modulated signal which means that no DM bits need be interpolated between two DM bits present and thus a high sampling frequency of several MHz and a clock frequency of several dozen MHz can be avoided so that the arrangement is suitable for integration with the so-called M.O.S. techniques. By avoiding the said conversion of the compressed signal into the uniform DM signal the occurrence of extra non-linear distortion is also prevented. This extra distortion occurs at the said conversion because the compressed DM signal which is already an approximation of a given analog data signal is in turn approximated with the aid of a uniform step size.

Figure 2:
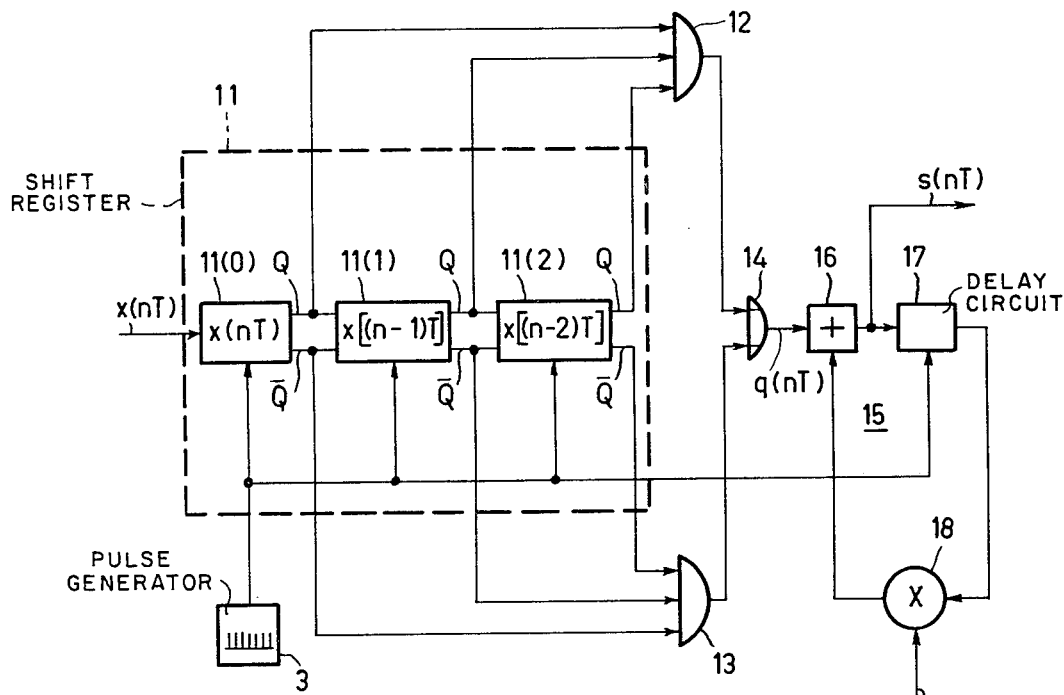
FIG. 2 shows a step size control circuit for use in the arrangement according to FIG. 1.

FIG. 2 shows an embodiment of the step size control circuit 4 used in FIG. 1 with which the step size $s(nT)$ is determined of the DM bit $x(nT)$ from a succession of three DCDM coded DM bits $x(nT)$, $x[(n-1)T,]$ $x[(n-1)T]$ and the preceding step size $s[(n-1)T]$. This circuit includes a shift register 11 having register elements 11(0), 11(1) and 11(2) each being provided with two outputs Q and $\overline{Q}$ which are inverse relative to each other and are controlled by clock pulses occurring with a period T which is equal to the DM sampling period. These clock pulses are derived from the clock pulse generator 3 of FIG. 1 separately shown in this Figure. The DM bits $x(nT)$ are applied to this shift register while three successive bits are written in the register namely the DM bits $x(nT)$, $x[(n-1)T]$ and $x[(n-2)T]$. This circuit analyses the three written DM bits for determining the step size $s(nT)$ associated with the DM bit $x(nT)$. In this embodiment it is determined whether the written DM bits are all 1 or all 0. To this end the outputs Q of the shift register elements 11(0), 11(1), 11(2) are each connected to an input of an AND gate 12 and the outputs $\overline{Q}$ of these shift register elements are each connected to an input of an AND gate 13. These AND gates 12 and 13 supply a pulse or 1 bit when the shift register elements 11(0), 11(1), 11(2) each comprise a 1 bit or a 0 bit. The pulses supplied by these AND gates 12 and 13 which may be considered as one-bit code words are applied through an OR gate 14 in a manner conventional for DCDM signals to an integrating network 15. In the Figure the output code words of the OR gate 14 are denoted by $q(nT)$.

In the embodiment shown this integrating network 15 is constituted by a first order recursive digital filter which is constituted in the conventional manner by an input circuit in the form of an adder circuit 16. The output code words of this adder circuit 16 constitute the step size code words $s(nT)$ which are applied in the manner shown in FIG. 1 to the delay circuit 9. In this recursive digital filter these output code words $s(nT)$ are also applied to a delay circuit 17 having a delay time T controlled by the clock pulse generator 3 which delay time is also equal to the DM sampling period. The output of this delay circuit 17 is connected to a multiplier 18 to which also a filter coefficient $c$ is applied for determining the product of the step size $s[(n-1)T]$ stored in the circuit 17 and this filter coefficient $c$. This product $c.s[(n-1)T]$ is applied to the adder circuit 16 to which also the code words $q(nT)$ are applied. The operation of the adder circuit adding its two input signals may be mathematically represented by $s(nT) = c.s[(n-1)T] + q(nT)$.

The filter coefficient $c$ which is applied to the multiplier 18 may likewise be derived from the source 5 shown in FIG. 1. The value of this filter coefficient $c$ is chosen in accordance with one of the conventional methods in such a manner that the transmission characteristic of this integrating network is equal to the transmission characteristic of the integrating network incorporated in the delta modulator supplying the delta-modulated signal.

Figure 3:
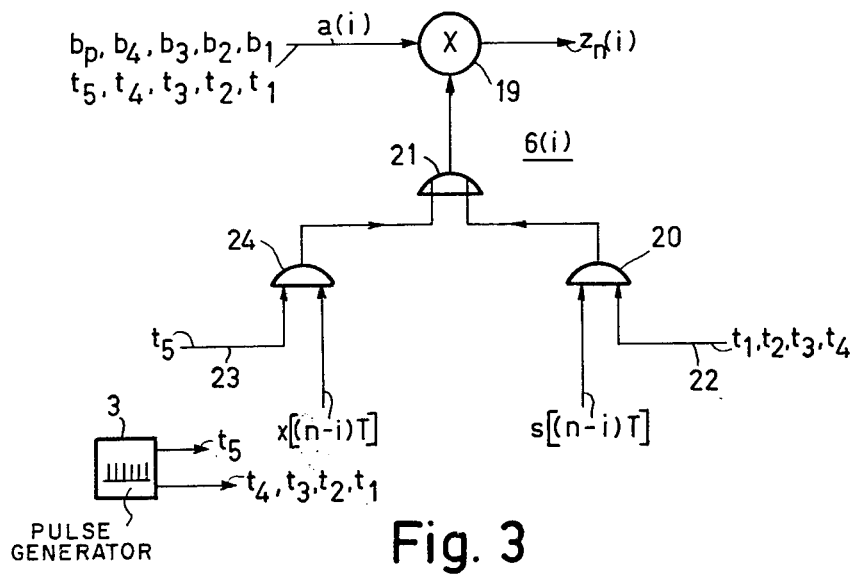
FIG. 3 shows a multiplier for use in the arrangement according to FIG. 1.

The multiplication of a step size $s$ $(n-i)T$ shown in FIG. 1, a filter coefficient $a(i)$ and a DM bit $x$ $[(n-i)T]$ is realized in the manner as described in greater detail in FIG. 3. This FIG. 3 shows a multiplier section $6(i)$ ($i = 0, 1, 2, \ldots N-1$) which is constituted by a standard multiplier 19 to which the bits $b_1$, $b_2$, $b_3$, $b_4$, $b_p$ of the coefficient $a(i)$ are applied in series starting with the last significant bit $b_1$ and increasing in significance to the most significant bit $b_4$ followed by the polarity bit $b_p$. These five bits occur synchronously at the input of the multiplier 19 with five successively occurring clock pulses $t_1$, $t_2$, $t_3$, $t_4$, $t_5$ which are generated within a DM sampling period T by the clock pulse generator 3. The four magnitude bits of the stepsize $s$ $[(n-i)T]$ are likewise applied in series and with increasing significance to the multiplier 19 and this through an AND gate 20 and an OR gate 21 and synchronously with the first four clock pulses $t_1$, $t_2$, $t_3$, $t_4$ of the clock pulse generator 3. These clock pulses are applied through a clock pulse input 22 in this AND gate 20 as is diagrammatically shown in the Figure. The fifth clock pulse $t_5$ is subsequently applied to a clock pulse input 23 of an AND gate 24 to which the DM bit operating as a polarity bit is applied through a second input and which is applied at the instant determined by the clock pulse $t_5$ through the OR gate 21 together with a polarity bit $b_p$ of the filter coefficient $a(i)$ to the multiplier 19. Thus a number given in a sign magnitude representation is obtained at the output of the OR gate 21 which for the purpose of multiplication by a filter coefficient is applied to the multiplier 19 supplying as an output code word such a second code word $z_n(i) = a(i) \cdot x [(n-i)T] \cdot s [(n-i)T] hu$.

Figure 4:
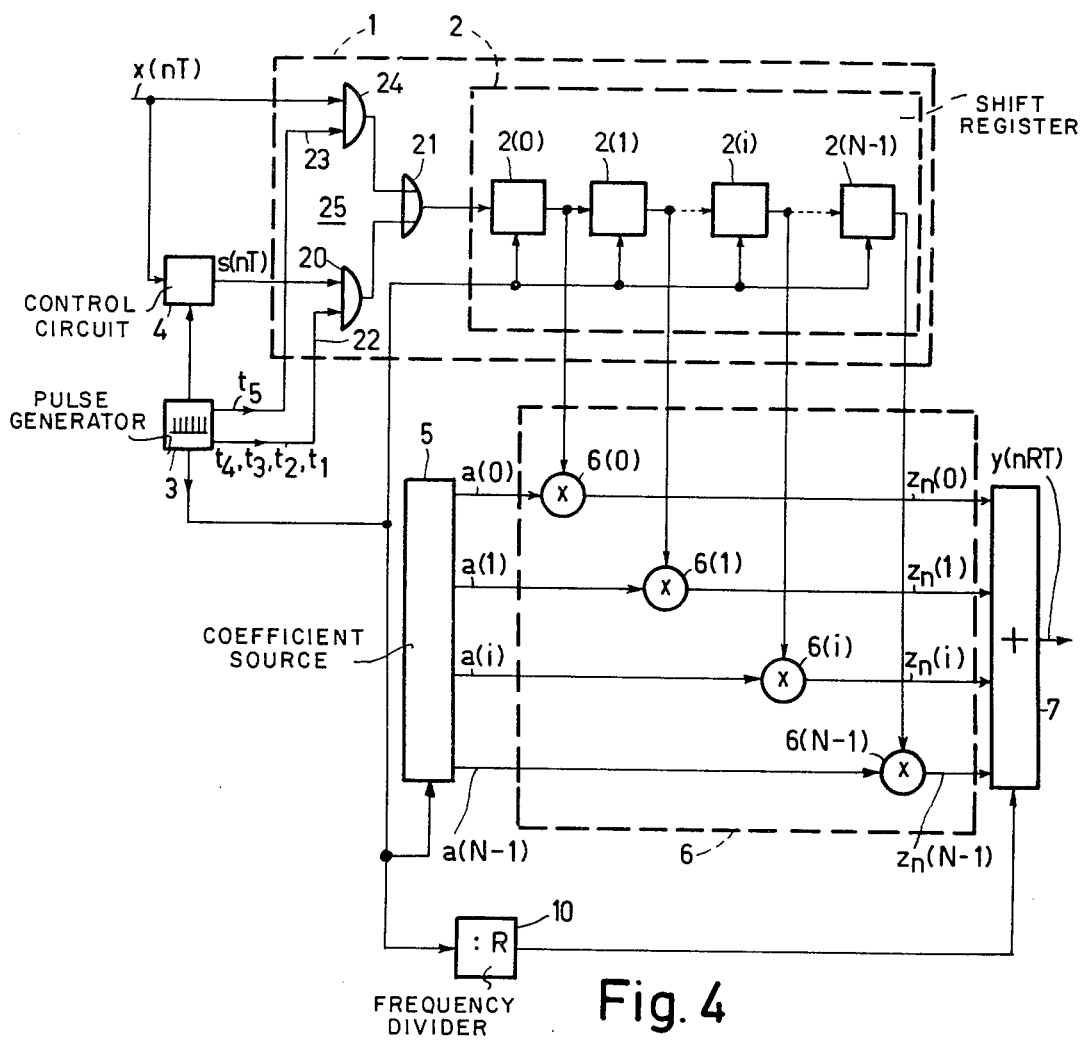
FIGS. 4 and 5 show modifications of the arrangement of FIG. 1.

FIG. 4 shows a modification of the arrangement shown in FIG. 1 for converting one-bit DM code words into 12-bit PCM code words. In this arrangement shown in FIG. 4, which largely corresponds to the arrangement of FIG. 1, elements corresponding to those in FIG. 1 have the same reference numerals. Also this arrangement shown in FIG. 4 is provided with an input circuit 1 to which the compressed delta-modulated signal $x(nT)$ is applied and which includes a delay circuit 2. This arrangement also includes a clock pulse generator 3 for generating control pulses for controlling the delay time of the circuit 2; a digital step size control circuit 4; a source 5 for a given number of digitally coded filter coefficients; a multiplier 6 and a combination device 7 which is controlled by the output pulses from the clock pulse generator 3 divided in frequency by a factor of R which division is realised by the frequency divider 10.

Likewise as in the arrangement of FIG. 1 it has also been assumed in this arrangement that the compression of the delta-modulated signal has taken place in accordance with the DCDM method so that also in this case the circuit 4 is identical to the circuit shown in FIG. 2. Here, too, the 1 and 0 DM bits are considered as the + and − polarity bits of the step size associated with the relevant DM bit and it is assumed that the composite bits of the different code words occur one after the other (in series).

This arrangement shown in FIG. 4 differs, however, from that in FIG. 1 in that the delay circuit 2 is constituted by a cascade arrangement of N delay sections $2(0), \ldots, 2(N-1)$ each being suitable for storing and supplying a binary number which is given by four magnitude bits and a polarity bit, which numbers are shifted in this delay circuit to the successive sections under the control of control pulses from the clock pulse generator 3 occurring with a period T.

This arrangement according to FIG. 4 also differs from that according to FIG. 1 in that the step size code words $s(nT)$ supplied by the circuit 4, likewise as the DM bits $x(nT)$, are applied to a second multiplier 25 incorporated in the input circuit 1 in the form of a gating circuit whose output is connected to the input of the delay circuit 2.

In the embodiment shown this gating circuit is built up in the same manner as the gating circuit of the multiplier section shown in FIG. 3 and also includes two AND gates 20 and 24 whose outputs are connected to inputs of the OR gate 21 whose output is connected to the input of the delay circuit 2. Also this gating circuit serves to combine a DM bit $x(nT)$ and a step size code word $s(nT)$ to a number in sign magnitude representation. To this end, likewise as in FIG. 3, the clock pulse generator supplies five clock pulses $t_1, \ldots t_5$ within a DM sampling period T whose clock pulses $t_1, \ldots t_4$ are applied to the clock pulse input 22 of the AND gate 20 and the clock pulse $t_5$ is applied to the clock pulse input 23 of the AND gate 24. Thus, synchronously with the clock pulses $t_1, \ldots t_4$, the bits of the code word consisting of four bits $s(nT)$ are applied through the AND gate 20 and the OR gate 21 to the delay section $2(0)$ and stored therein and subsequently the polarity bit of the code word $s(nT)$ characterized by the DM bit $x(nT)$ is applied synchronously with the clock pulse $t_5$ through the AND gate 24 and the OR gate 21 to the delay section $2(0)$ and stored therein.

Also in this embodiment the delay circuit 2, the multiplier 6, the combination device 7 and the source 5 constitute a non-recursive digital filter for suppressing the quantisation noise components located beyond the signal band of 0–4 KHz as well as accurately limiting the signal band at 4 KHz. In this embodiment, however, the multiplier sections $6(0), \ldots 6(i), \ldots 6(N-1)$ are only standard multipliers. In fact, this has become possible in that the step size $s(nT)$ and the polarity bit characterized by the DM bit $x(nT)$ are already combined at the input of the delay circuit 2 to one single member in a sign magnitude representation.

Figure 5:
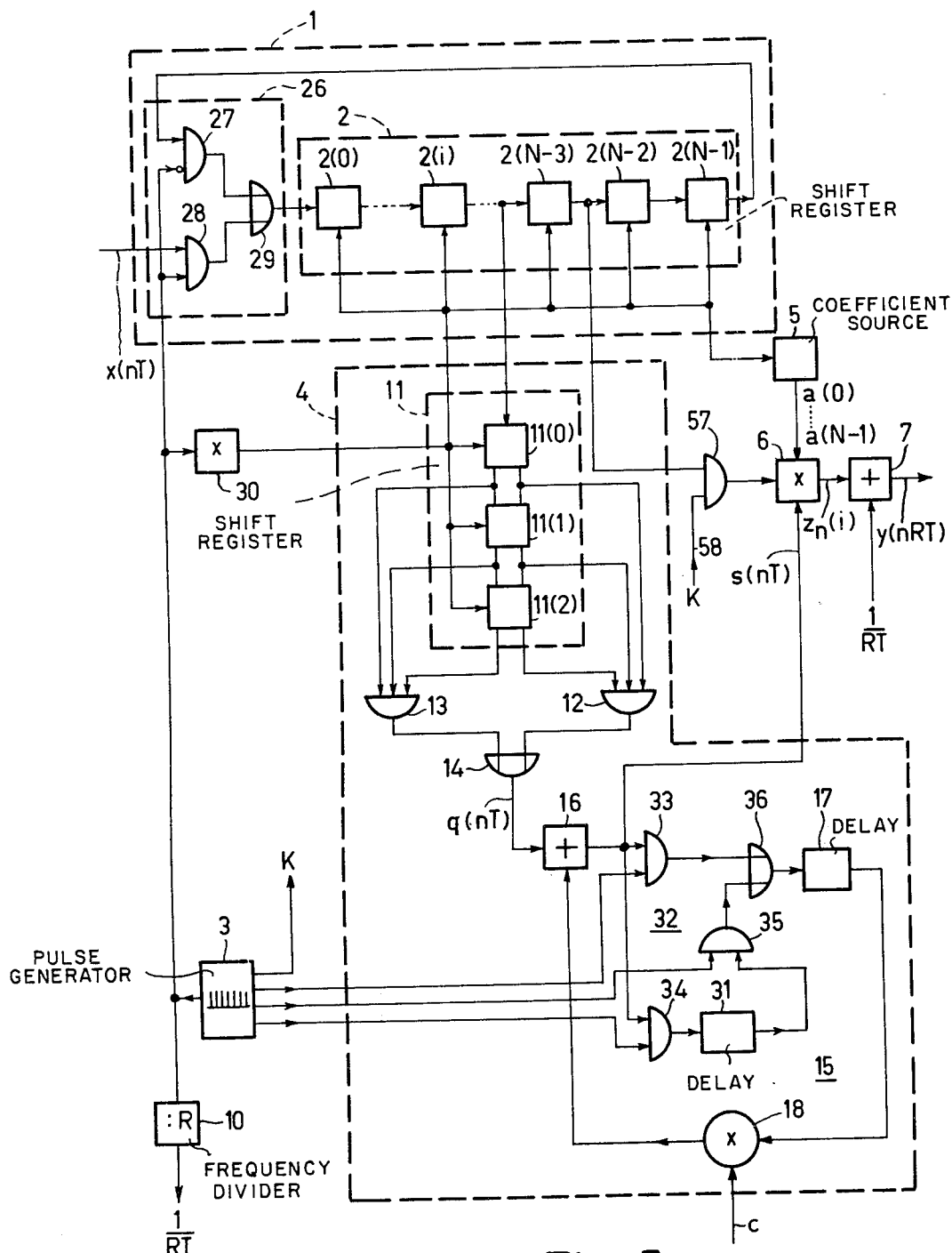

FIG. 5 shows a further embodiment of the arrangement according to the invention in which it has likewise been assumed that the compression of the delta-modulated signal has taken place in accordance with the DCDM method. Also in this case the 1 and 0 DM bits are considered as the polarity bit of the step size associated with the relevant DM bit. It has also been assumed that the composite bits of the different code words occur one after the other.

This embodiment shown in FIG. 5 also includes an input circuit 1 with a delay circuit 2 consisting of a shift register with N shift register elements $2(0), \ldots 2(N-1)$ each being suitable for storing and supplying one-bit code words while the delay time is controlled by the clock pulse generator 3. Furthermore this arrangement includes a step size control circuit 4, a multiplier 6, a source 5 for a given number of filter coefficients and a combination device 7 which is controlled by the clock pulse generator 3 and adapted for adding the second code words supplied by the multiplier 6 and for supplying at a frequency $f_p = 1/(RT)$ of 12-bit PCM code words.

This embodiment differs mainly from the previous embodiments in that the N second code words $z_n(i)$ to be calculated within one sampling period T of the DM signal are not all simultaneously determined (in parallel), but successively (in series) and are also added in that order to the adder 7. To this end the shift register 2 in which the DM bits are written in is formed as a feedback shift register where the output of the shift register element 2(N−1) is connected to a first input of a switching circuit 26. The DM bits $x(nT)$ are applied through a second input to this switching circuit 26, which bits, likewise as in the foregoing, occur with a period T. This switching circuit 26 is furthermore controlled by clock pulses occurring with a period T and synchronously with the DM bits and originating from the clock pulse generator 3. By means of this switching circuit 26 the input of the shift register element 2(O) is connected upon the occurrence of such a clock pulse to the input of the input circuit 1 so that in this element 2(O) a DM bit $x(nT)$ applied to the circuit is written in while simultaneously the already present content of the register 2 is shifted one place so that the DM bit stored in the register element 2(N−1) disappears from this register. In the absence of such a clock pulse the input of the element 2(O) is connected to the output of the shift register element 2(N−1). As has been shown in the Figure the switching circuit 26 is constituted by two AND gates 27 and 28 and an OR gate 29 which are connected together in the manner shown in the Figure and to the inputs of the switch and the elements 2(O). Said clock pulses are applied to clock pulse inputs of the AND gates 27 and 28 while the clock pulse input of the AND gate 27 is constituted by a blocking input.

Shifting of the contents of the shift register elements is not effected with shift pulses which, as in the foregoing, occur with the sampling period T but occur with a period T/(N+1) so that within a period T of the DM bits the contents of the shift register elements 2(O)–2(N−1) are once cross-coupled in the feedback shift register or, in other words, all DM bits stored in the shift register have appeared once at the output of the last shift register element 2(N−1) and are again written in the register. This shift register 2 is controlled by shift pulses occurring with a frequency (N+1)/T and derived in the manner shown in the Figure with the aid of a frequency multiplier 30 from the clock pulses occurring with a frequency 1/T supplied by the generator 3 for controlling the switching circuit 26.

To multiply the DM bits with the associated step sizes and filter coefficients stored in this shift register, the output of the shift register element 2(N−3) in this embodiment is connected through a switching circuit 57 to an input of the multiplier 6 and the N−2 DM bits are applied to this multiplier 6 in one period which bits occur one after the other at the output of the register element 2(N−3) and which are stored in the register elements 2(O) −2(N−3) immediately after writing a new DM bit in the register element 2(O) and applied to the input circuit 1.

Figure 6:
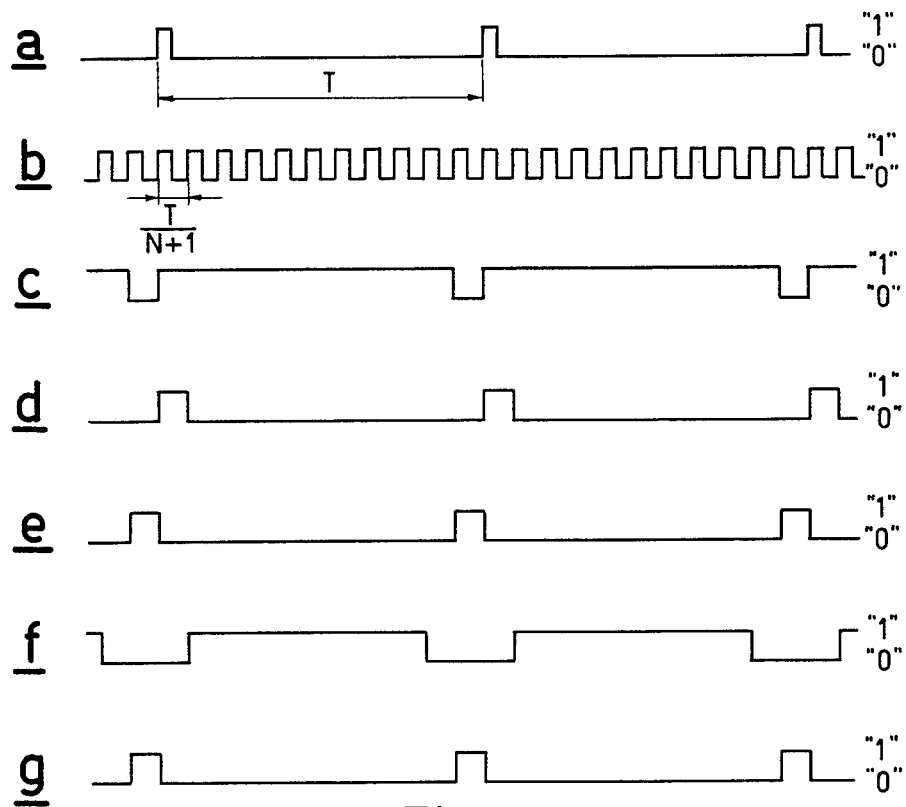
FIG. 6 shows some time diagrams to explain the operation of the arrangement of FIG. 5.

In this embodiment the switching circuit 57 is constituted by an AND gate which is connected in the manner shown in the Figure to the register element 2(N−3) and the multiplier 6 and to which clock pulses K are applied through a clock pulse input 58 which are generated by the clock pulse generator 3 and which control these AND gates in a manner as is shown in greater detail in time diagrams in FIG. 6.

The multiplier 6 in this embodiment is constituted by one multiplier section of the type as is shown in detail in FIG. 3. Also the filter coefficients $a(i)$ of the source 5 are applied one after the other to the multiplier in this embodiment as well as the step size code words $s(nT)$ of the step size control circuit 4.

After writing a DM bit $x(n\ T)$ in the register 2, a series of N−2 second code words $z_n(i)$ ($i=0, \ldots, N-3$) occurring one after the other is supplied by the multiplier 6 and applied to the adder 7 whose contents are again read out with a period RT.

To determine the step size associated with a DM bit occurring at the output of the shift register element 2(N−3) the input of the step size control circuit 4 is connected to the input of this shift register element 2(N−3). The control circuit 4 shown in this embodiment is mainly formed in the same manner as the control circuit 4 shown in greater detail in FIG. 2. Elements corresponding to those in FIG. 2 have the same reference numerals in this Figure. This control circuit is also provided with a shift register 11 having three shift register elements 11(0), 11(1) and 11(2) whose contents are shifted with a shift frequency (N+1)/T which is equal to the shift frequency of the contents of the shift register 2. Due to the above-mentioned connection of this control circuit 4 with the shift register 2 the contents of the element 2(N−4) upon shifting the contents of the shift register 2 is written in the element 2(N−3) of the register 2 and in the element 11(0) of the register 11 so that also in this control circuit 4 the step size $s(nT)$ is determined for a DM bit $x(nT)$ written in the element 2(N−3) from the three successive DM bits $x(nT), x[(u-1)T], x[(n-2)T]$ and the preceding step size $s[(n-1)T]$.

The step size control circuit 4 shown in this embodiment differs, however, from that of FIG. 2 in that a second delay circuit 31 in addition to the delay circuit 17 is incorporated in the integrating network 15 which circuit is formed in the same manner as the circuit 17 and which is coupled by means of a switching circuit 32 to this delay circuit 17. More particularly this switching circuit 32 consists of three AND gates 33, 34 and 35 and an OR gate 36 which are connected in the manner shown in the Figure to the output of the adder circuit 16 and the delay circuits 17 and 31. This switching circuit 32 is controlled by a number of switching signals which are derived from the clock pulse generator 3 and which are also shown in detail in a number of time digrams in FIG. 6. In this FIG. 6 the diagram $a$ shows the clock pulses with the period T changing over the switch 26 for the duration of the indicated clock pulses from the rest condition, where the input of the element 2(O) is connected to the output of the element 2(N−1) of the shift register 2, to the condition where the input of the element 2(O) is connected to the input of the circuit so that a new DM bit can be written in the register 2. The diagram $b$ shows the shift pulses for the shift registers 2 and 11 which shift pulses also serve as control pulses for the delay circuit 17 occurring with a period T/(N+1) while in this diagram the number of shift register elements N of the register 2 is taken to be equal to 10. The diagrams $c$, $d$, $e$ and $f$ show the switching pulses which are applied to the AND gate 33, 34, 35 and 57, respectively, while furthermore the diagram g shows the control pulses for the delay circuit 31.

Thus after writing a new DM bit in the register 2 the step size associated with the DM bit stored at that moment in the shift register element $2(N-3)$ is written by the described switching circuit 32 in the delay circuit 17 and in the delay circuit 31. This step size stored in the delay circuit 31 is maintained therein until the contents of the register 2 are once shifted completely whereafter the contents of the circuit 31 are transferred through the AND gate 35 to the circuit 17 so that the state of the integrating network is again equal to the state in which it was immediately after writing a new DM bit in the register 2.

Although in the foregoing embodiments it has been assumed that the delta-modulated signal is coded in accordance with the DCDM method, these embodiments may alternatively be used if for the delta-modulated signal a step size control according to another method, for example, that of HIDM (High Information Delta Modulation) is used. In the latter method additional use may be made of the fact that the step sizes are exclusively powers of two and the wordlength of the words supplied by the step size control circuit may be drastically limited; namely by considering exclusively the exponent of the basic number two coded in accordance with a binary number. Also in this case the structure of the multiplier is considerably simplified.

Figure 7:
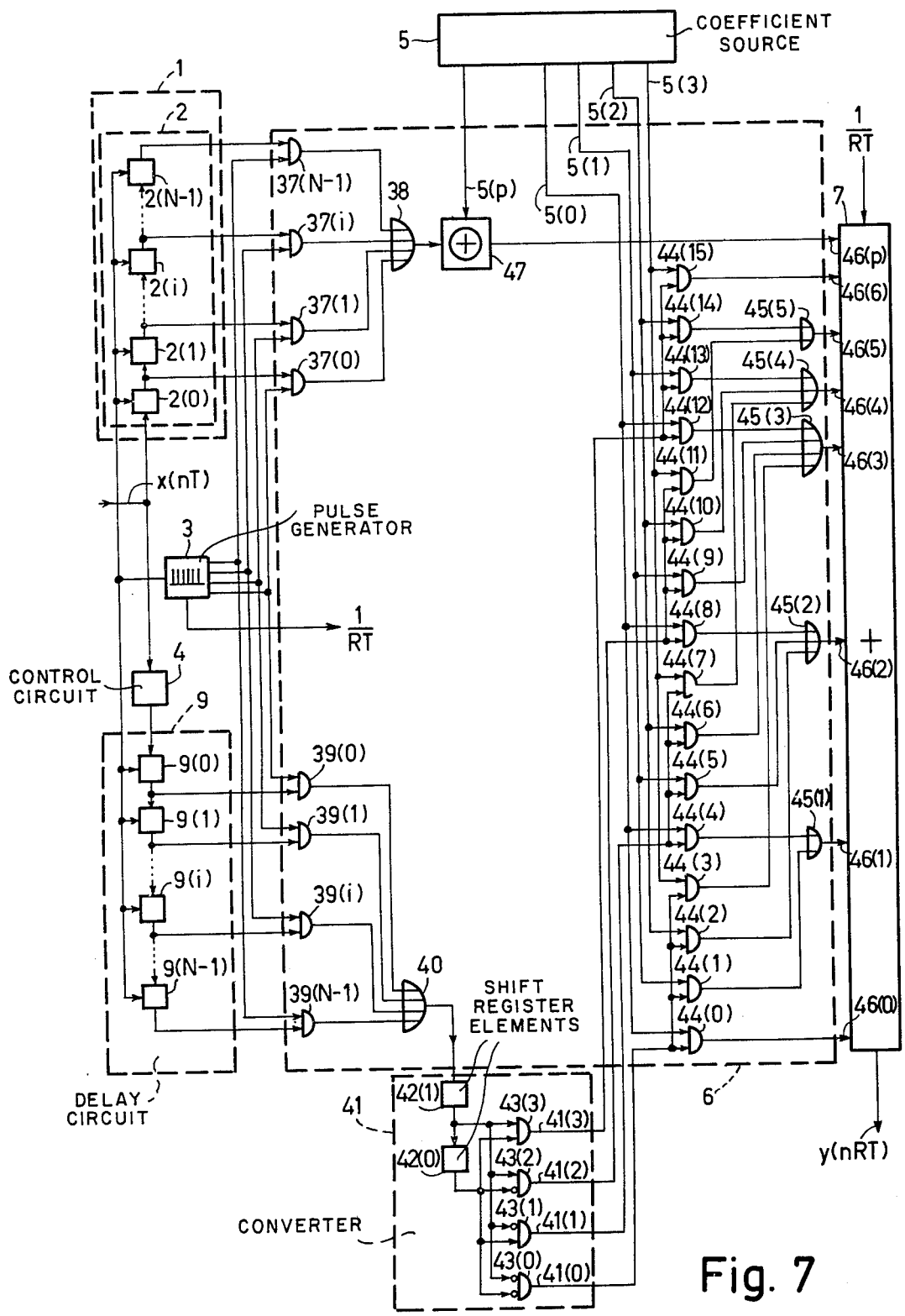
FIG. 7 shows a third modification of the arrangement of FIG. 1.

FIG. 7 shows an embodiment which is based on the above-mentioned principle of step size coding and in which the described advantages become manifest. This embodiment shown in FIG. 7 largely corresponds to the embodiment of FIG. 1 and likewise includes an input circuit 1 which exclusively includes the shift register 2 with elements $2(O)-2(N-1)$ in which the successive DM bits are written and shifted with a shift period which is equal to the DM sampling period T. This embodiment also includes a step size control circuit 4 which is formed in the manner as will be further described with reference to FIG. 8 and which supplies 2-bit code words each exclusively characterizing the exponent of the power of two of the step size. These code words are also written in a delay circuit 9 having delay sections $9(O)-9(N-1)$ and are shifted therein synchronously with the shifting of the DM bits in the register 2. In this embodiment the step sizes and the DM bits are also applied to a multiplier 6 to which also filter coefficients are applied originating from the source 5 for a given number of filter coefficients. The second code words $z_n(i)$ supplied by the multiplier 6 are added in the adder 7, likewise as in FIG. 1, whose contents are read out with a period RT.

The arrangement shown in FIG. 7 differs in the structure of the step size control circuit 4 and from the arrangement of FIg. 1 in that the structure of the multiplier 6 is considerably simplified. More particularly in this embodiment the multiplier is constituted by a first system of AND gates $37(O)-37(N-1)$ each of which have an input connected in the manner shown in the Figure to the shift register 2 and their outputs connected to an OR gate 38, and a second system of AND gates $39(O)-39(N-1)$ each having an input connected in the manner as shown in the Figure to the delay circuit 9 and their outputs connected to an OR gate 40. Clock pulses are applied through clock pulse inputs to these AND gates which occur simultaneously for the AND gates with the same index placed between brackets, for example, $37(i)$ and $39(i)$ and occur one after the other with unequal indices for the AND gates. In this case the first clock pulse is applied to the AND gates with index (O) and the last clock pulse of N clock pulses is applied to the AND gates with index $(N-1)$. Thus a DM bit occurs in a given clock pulse of the N clock pulses at the output of the OR gate 38 which bit is also considered as a polarity bit of a step size code word which, as already stated, exclusively is an integral power of two in this embodiment. Of the step size code word associated with the DM bit at the output of the OR gate 38 the exponent of the basis number two exclusively occurs simultaneously at the output of the OR gate 40 and this with the bits in series. This 2-bit binary coded exponent is applied to a converter 41 converting this 2-bit exponent into a four-bit number in which not more than one bit has the binary value 1.

The said converter 41 is constituted in this embodiment by a register having two shift register elements 42(0) and 42(1) and a number of AND gates $43(0)-43(3)$ whose outputs are oonnected in the manner shown in the Figure to the register elements 42(0) and 42(1) and in which the AND gates 43(1) and 43(2) are each provided with a blocking input and the AND gate 43(0) has two blocking inputs. When the least significant bit of the exponent is written in the register element 42(0), then for an exponent 00 the outputs $41(0)-41(3)$ of these AND gates $43(0)-43(3)$ yield the binary values 1000, for an exponent 10 the values 0010 and for an exponent 11 the values 0001.

The binary values obtained in this manner are applied to a third system of AND gates $44(0)-44(15)$. More particularly the output leads $41(0)-41(3)$ are connected in the manner shown in the Figure to control pulse inputs of these AND gates $44(0)-44(15)$. The filter coefficients are also applied to these AND gates which coefficients are constituted, as in the foregoing embodiments, by code words having four magnitude bits and one polarity bit. In this embodiment the bits of these code words are derived through parallel outputs from the source 5 supplying the required filter coefficients one after the other (in series). To this end this source is provided with a polarity bit output $5(p)$ and four outputs $5(0)-5(3)$ for the magnitude bits. The least significant coefficient bit occurs at the output $5(0)$ and the most significant bit occurs at the output $5(3)$. These outputs $5(0)-5(3)$ of the source 5 are connected in the manner shown in the Figure to a second input of the AND gates $44(0)-44(15)$, and the outputs of the AND gates $44(1)-44(14)$ are in turn connected in the manner shown in inputs of OR gates $45(1)-45(5)$ so that binary values 1 and 0 occur simultaneously at the outputs 46(0) and 46(6) of AND gates 44(0) and 44(15) and the outputs $46(1)-46(5)$ of the OR gates $45(1)-45(5)$. These binary values 1 and 0 jointly form the magnitude bits of a second code word $z_n(i)$ with parallel bits in which the significance of the bit is given by the serial number of the output. This means that, for example, a 1 bit occurring at the output 46(3) in the code word $z_n(i)$ has the value $2^3$. The polarity bit of this code word $z_n(i)$ is derived from a modulo-2-gate 47 to which the DM bit supplied by the OR gate 38 and the polarity bit of the filter coefficient occurring at the output $5(p)$ of the source 5 are applied through two inputs.

In the embodiment shown multiplication of the filter coefficient, step size and DM bit is effected by cooperation of the converter 41, the third system of AND gates 44(0)–44(15) and the OR gates 45(1)–45(5). When more particularly the contents of the shift register element 2($i$) are applied to the output of the OR gate 38, the exponent of the step size associated with this DM bit is simultaneously applied to the output of the OR gate 40. When, for example, the DM bit is a 0 bit (characterizing a negative polarity) and when the exponent has the binary value 00 (unit step size) and the filter coefficient has the binary value 1011 (with the first bit as the least significant bit) with a negative polarity (likewise characterized by a 0 bit), a binary 1 occurs at the output 41(0) of the circuit 41 and the second code word $z_n(i)$ has the binary value 1011000 in which the first bit represents the least significant bit occurring at the output 46(0). The polarity of this code word is determined by a 1 bit supplied by the modulo-2-gate 47 and characterizing a positive polarity.

When unlike the foregoing the exponent is given by the binary number 11 (this means a step size of eight units) the code word $z_n(i)$ for the same filter coefficient 1011 is given by the binary number 0001011. As compared with the foregoing example this means a multiplication of the filter coefficient by a factor of eight and hence by the value of the step size. In this embodiment the multiplication is thus reduced to a shifting of the bits of the filter coefficient along the parallel outputs of the multiplier 6 over a number of places given by the exponent of the power of two in the step size.

Figure 8:
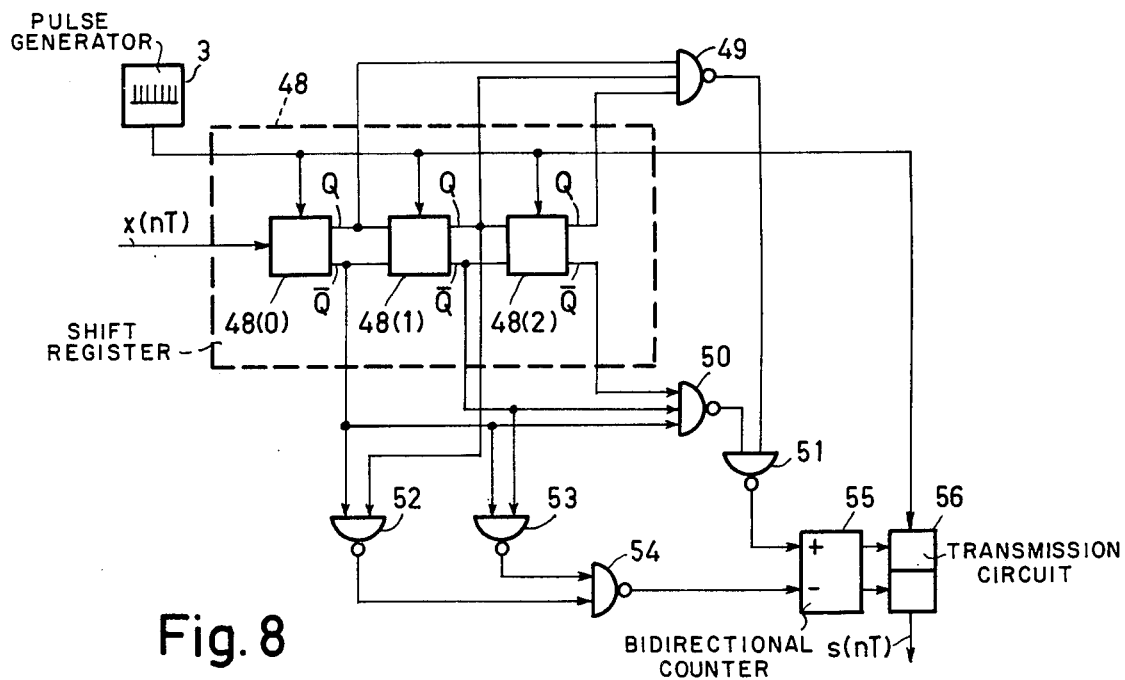
FIG. 8 shows a step size control circuit for use in the arrangement of FIG. 7.

The step size control circuit used in this embodiment of FIG. 7 is illustrated in detail in FIG. 8. This control circuit includes a shift register 48 having three shift register elements 48(0), 48(1) and 48(2) each having two outputs Q and $\overline{Q}$ which convey signals which are inverted relative to each other. Also, this step size control circuit includes two systems of NAND circuits 49, 50, 51 and 52, 53, 54. The circuits 49, 50, 51 are connected together in the manner shown in the Figure and to the outputs Q and $\overline{Q}$ of the three shift register elements 48(0), 48(1) and 48(2) and the circuits 52, 53, 54 are likewise connected together in the manner shown in the Figure and to the outputs Q and $\overline{Q}$ of the two first shift register elements 48(0) and 48(1). In this embodiment a pulse occurs at the output of the NAND circuit 51 every time after the occurrence of three mutually equal DM bits (either 1 bits or 0 bits) while every time after the occurrence of two mutually different DM bits (either a combination of 0,1 bits or a combination of 1,0 bits) a pulse occurs at the output of the NAND circuit 54. The pulses occurring at the output of the circuit 51 characterize a continuous increase of the original analog signal and are utilized to enlarge the step size. The pulses occurring at the output of the circuit 51 characterize the transitions of the signal from an increasing value, to a decreasing value, or conversely and they are utilized for reducing the step size. To this end the output pulses from this circuit 54 are applied to the subtractor input of a bidirectional counter 55 which is formed in this embodiment as a 2-bit bidirectional counter to which the output pulses of the circuit 51 are applied as adder pulses. The counting state of this counter gives the said binary coded exponent in the step-size and is periodically written with a period T through a transmission circuit 56 controlled by the clock pulse oscillator 3 in the register element 9(0) shown in FIG. 7.

It will be evident from the foregoing that if none of the above-mentioned states in the register 48 occurs, the counting state of the counter 55 remains unchanged.

It is to be noted that in the embodiments of FIGS. 1, 4 and 7 the delay circuit 2 and in the FIGS. 1 and 7 the delay circuit 9 may also be formed in a cross-coupled version so that in FIG. 7 the AND gates 37(0)–38(N−1) and 39(0)–39(N−1) and the OR gates 38 and 40 can be omitted and in FIGS. 1 and 4 the number of multipliers can be reduced. These delay circuits may also be formed as a RAM (Random Access Memory).

Although in different embodiments it has been assumed that composite bits of the different code words occur in series or in parallel, these bits may alternatively occur in parallel or in series. For the arrangement of FIG. 1 this means, however, that the multiplier shown in FIG. 3 is to be additionally provided with at least one series-parallel converter for the step size bits.

It is also to be noted that the combination device 7 which is indicated in the foregoing embodiments as an adder or an accumulator and which fulfils an integration function may alternatively be formed as a first order recursive digital filter to which the code words $z_n(i)$ for $i=0, \ldots N-1$ are applied and whose input summing circuit firstly determines the sum $$\sum_{i=0}^{N-1} z_n(i) + c \sum_{i=0}^{N-1} z_{n-1}(i)$$

before the step size $s(nT)$ is supplied (compare the network 15 in FIG. 2).

A recursive digital filter may alternatively replace the non-recursive digital filter constituted in FIG. 4 by the delay circuit 2, the multiplier 6 and the combination device 7.

Although the embodiments shown describe the conversion of a compressed DM signal into a PCM signal, each of these embodiments may alternatively be used for converting a compressed DPCM signal into a PCM signal in which, however, the storage capacity of the shift register elements 2($i$) must be extended to multibit words and the shift register 2 according to FIGS. 1, 5 and 7 may be replaced by a delay circuit which is equivalent to the delay circuit 9.

It is also to be noted that the considered code word may be given a different representation instead of the sign magnitude representation; for example, in the two-complement or one-complement representation. For the code word given by the combination of the DM bit and the associated step size code word in sign magnitude a conversion will then, however, have to be performed in which case this sign magnitude given code word is converted into a code word in, for example, the said two-component representation.

When the delta-modulated signal which is applied in the embodiments to the input circuit 1 is obtained by means of sigma-delta modulation, the integrating function of the combination device 7 may be avoided and this combination device 7 may be reset to its zero state every time after a new DM bit is applied to the arrangement and previously thereto may be read out every time. In this special case of sigma-delta modulation, in which it is likewise assumed that the frequency with which the PCM words $y(nRT)$ occur is a factor of R smaller than the frequency with which the DM bits $x(nT)$ occur, it is possible to write in the registers 1 and 9 in FIGS. 1 and 7 as well as in the register 1 in FIGS. 4 and 5 firstly R new code words (either DM bits or step size code words) when simultaneously shifting the already present contents of these registers before the required multiplications and additions are carried out. As a result an extra economy can be obtained in the speed of operation.

What is claimed is:

1. An arrangement for converting a compressed delta-modulated signal into a pulse code-modulated signal, said compressed delta-modulated signal being constituted by a succession of code words occurring with a given sampling frequency and each consisting of at least one bit, comprising:

an input circuit comprising a delay circuit comprising a cascade arrangement of N delay sections, including means in each of said sections for storing a code word of a succession of N code words of said compressed delta-modulated signal, N being a predetermined integer, to which input circuit said compressed delta-modulated signal is applied and in which a predetermined corresponding auxiliary code word is written in said delay circuit for each of said code words of said delta-modulated signal;

a clock pulse generator for generating control pulses which are applied to said delay circuit for controlling the delay time;

a source for a predetermined number of filter coefficients;

a multiplier, responsive to the application of said auxiliary code words and said filter coefficients for generating a number of second code words, said number of second code words corresponding to said predetermined number of filter coefficients, each of said second code words being related to the digital product of one of said code words of said compressed delta-modulated signal and an associated filter coefficient;

a combination device to which said second code words are applied for addition, controlled by clock pulses from said clock pulse generator; said clock pulses occurring within a period which is an integral multiple of the sampling period; and a step size control circuit connected to a second delay circuit having N second delay sections, in each of said sections a step size code word of a succession of N step size code words being stored.

2. An arrangement for converting a compressed delta-modulated signal into a pulse code-modulated signal, said compressed delta-modulated signal being constituted by a succession of code words occurring with a given sampling frequency and each consisting of at least one bit, comprising:

an input circuit comprising a delay circuit comprising a cascade arrangement of N delay sections, including means in each of said sections for storing a code word of a succession of N code words of said compressed delta-modulated signal, N being a predetermined integer, to which input circuit said compressed delta-modulated signal is applied and in which a predetermined corresponding auxiliary code word is written in said delay circuit for each of said code words of said delta-modulated signal;

a clock pulse generator for generating control pulses which are applied to said delay circuit for controlling the delay time;

a source for a predetermined number of filter coefficients;

a multiplier, responsive to the application of said auxiliary code words and said filter coefficients for generating a number of second code words, said number of second code words corresponding to said predetermined number of filter coefficients, each of said second code words being related to the digital product of one of said code words of said compressed delta-modulated signal and an associated filter coefficient;

a combination device to which said second code words are applied for addition, controlled by clock pulses from said clock pulse generator; said clock pulses occurring within a period which is an integral multiple of the sampling period; and said delay circuit having an input and an output, said output of said delay circuit being coupled to its input.

3. An arrangement as claimed in claim 2, wherein said input circuit comprises a second multiplier to which said compressed delta-modulated signal and said step size words are applied, for multiplying a code word of the delta-modulated signal by an associated step size code word, the output of said second multiplier being coupled to the input of said delay circuit.

4. An arrangement as claimed in claim 2, wherein the output of one of the said delay sections is coupled to an input of said multiplier.

5. An arrangement as claimed in claim 4, wherein the step size control circuit has an input connected to the input of said delay section associated with the delay circuit in which the code words of said compressed delta-modulated signal are stored.

6. An arrangement as claimed in claim 5, wherein the step size associated with a code word in the compressed delta-modulated signal is given by an integral power of two.

7. An arrangement for converting a compressed delta-modulated signal into a pulse code-modulated signal, said compressed delta-modulated signal being constituted by a succession of code words occurring with a given sampling frequency and each consisting of at least one bit, comprising:

an input circuit comprising a delay circuit comprising a cascade arrangement of N delay sections, including means in each of said sections for storing a code word of a succession of N code words of said compressed delta-modulated signal, N being a predetermined integer, to which input circuit said compressed delta-modulated signal is applied and in which a predetermined corresponding auxiliary code word is written in said delay circuit for each of said code words of said delta-modulated signal;

a clock pulse generator for generating control pulses which are applied to said delay circuit for controlling the delay time;

a source for a predetermined number of filter coefficients;

a multiplier, responsive to the application of said auxiliary code words and said filter coefficients for generating a number of second code words, said number of second code words corresponding to said predetermined number of filter coefficients, each of said second code words being related to the digital product of one of said code words of said compressed delta-modulated signal and an associated filter coefficient;

a combination device to which said second code words are applied for addition, controlled by clock pulses from said clock pulse generator; said clock pulses occurring within a period which is an integral multiple of the sampling period; and
a digital step size control circuit to which said delta-modulated signal is applied for generating a digitally coded step size word for each of said code words in said delta-modulated signal.

* * * * *

UNITED STATES PATENT AND TRADEMARK OFFICE
CERTIFICATE OF CORRECTION

PATENT NO. : 4,002,981
DATED : January 11, 1977
INVENTOR(S) : LUDWIG DESIRE' JOHAN EGGERMONT It is certified that error appears in the above-identified patent and that said Letters Patent are hereby corrected as shown below:

Column 1, line 37, "(DCDM)" should be --(DCDM))-- line 38, after "Panter;" insert

--"Modulatim, Noise and Spectral Analysis";--

Column 2, line 31, "said" should be --the--

Column 7, line 42, cancel "hu"

Column 11, line 56, "FIg" should be --Fig--

Signed and Sealed this

Tenth Day of May 1977

[SEAL]

Attest:

RUTH C. MASON
*Attesting Officer*

C. MARSHALL DANN
*Commissioner of Patents and Trademarks*